United States Patent
Tam

[19]

[11] Patent Number: 5,869,995
[45] Date of Patent: Feb. 9, 1999

[54] OUTPUT STAGE HAVING A HIGH DISABLED OUTPUT IMPEDANCE AND A LOW POWER INTEGRATED BACK BUFFER TO PROVIDE DISABLED OUTPUT DEVICE PROTECTION

[75] Inventor: Kimo Y. F. Tam, Arlington, Mass.

[73] Assignee: Analog Devices, Inc., Norwood, Mass.

[21] Appl. No.: 747,640

[22] Filed: Nov. 13, 1996

[51] Int. Cl.[6] .................. H03K 17/615; H03K 19/082
[52] U.S. Cl. .................. 327/484; 328/108; 328/483; 328/185; 328/546; 326/56
[58] Field of Search .................. 327/323, 485, 327/546, 545, 480, 185, 544, 483, 310, 312, 379, 100, 530, 108; 326/51, 56, 21; 363/127

[56] References Cited

U.S. PATENT DOCUMENTS

| 5,170,335 | 12/1992 | Brokaw | 363/127 |
| 5,179,293 | 1/1993 | Hilton | 327/480 |
| 5,284,047 | 2/1994 | Brokaw | 73/35.07 |
| 5,467,038 | 11/1995 | Mostley et al. | 327/185 |

OTHER PUBLICATIONS

The Monolithic Op Amp: A Tutorial Study, James E. Solomon, IEEE J. Solid–State Circuits, Vol. SC–9, pp. 12–30, Dec. 1974.
Analog Devices 250 MHz, 10ns Switching Multiplexers w/Amplifier, AD8170/AD8174, Specification, pp. 1–15.
Analog Devices 750 Mhz, 3.8mA 10ns Switching Multiplexes, AD8180/AD8182, Specification, pp. 1–12.
Analog Devices, 16 x 16 Crosspoint Switch Array, AD75019.
Burr–Brown, MPC102 Wide–Bandwidth Dual 2x 1 Video Multiplexer, pp. 1–16, Nov. 1993.
Gennum Corporation, GY4102 Fast Toggling Video Switch Data Sheet, Feb. 1991 Rev. Jul. 1991.
Linear Technology, 150 MHz Video Multiplexers, LT1203/LT1205, pp. 1–16.
Maxim Engineering Journal, New IC s Boost Video Performance, vol. 17.
Siliconix, Truth Tables and Ordering Information DG535/536, P–32167, Rev. Nov. 15, 1993.
Siliconix, 4–/8– Channel Wideband Video Multiplexers, DG534A/538A, P.32167, Rev. Nov. 15, 1993.

*Primary Examiner*—Dinh Le
*Attorney, Agent, or Firm*—Wolf, Greenfield & Sacks, P.C.

[57] ABSTRACT

A high impedance node of a transimpedance stage drives the input of a unity-gain forward buffer. A unity-gain integrated back-buffer is enabled to drive the high-impedance node from the output of the forward buffer when the forward buffer is disabled. A voltage from the forward buffer limits the reverse-biasing of all transistors in the back-buffer when the back buffer is disabled, and a voltage from the back-buffer limits the reverse-biasing of all transistors in the forward buffer when the forward buffer is disabled. The output-driver transistors of the forward buffer are bootstrapped to the output voltage through resistors which, when the forward buffer is enabled, bias pre-driver transistor coupled to the output-driver transistors. Neither the forward buffer nor the back-buffer consume a significant amount of power when not enabled.

17 Claims, 2 Drawing Sheets

OUTPUT STAGE HAVING A HIGH DISABLED OUTPUT IMPEDANCE AND A LOW POWER INTEGRATED BACK BUFFER TO PROVIDE DISABLED OUTPUT DEVICE PROTECTION

BACKGROUND OF THE INVENTION

1. Field of the Invention

The present invention relates generally to transistor breakdown protection circuits and, more particularly, to a circuit for buffering an output voltage including a low-power integrated back buffer that limits the reverse-biasing of disabled transistors in the circuit.

2. Discussion of Related Art

A bipolar transistor, when correctly biased, may provide signal amplification between, for example, its base and its collector. One variable that measures such base-to-collector signal amplification is the current amplification factor ($\beta$), i.e., the ratio of collector current to base current, of the transistor. In normal operation, a bipolar transistor typically will have its base-to-emitter junction forward-biased by at least (approximately) 0.7 volts and will have its base-to-collector junction reverse-biased such that, when a signal is placed at the base node, an amplified signal will be provided at one of its current nodes, i.e., its collector or emitter. If, however, a p-n junction of a transistor is reverse-biased by a voltage above a particular threshold voltage, damage to the transistor may result. For example, if the emitter-base junction of a transistor is reverse-biased by too high a voltage: (1) a phenomena known as breakdown may occur at the junction when the reverse-bias voltage exceeds the emitter-base breakdown voltage (BVebo), or (2) the current amplification factor ($\beta$) may be degraded (i.e., $\beta$ degradation), which typically occurs at voltages substantially less than BVebo.

Occasionally, bipolar transistors are used in circuits wherein the (amplifying) transistors are disabled temporarily, e.g., when a biasing signal that maintains a transistor in its linear region is removed, but wherein the transistor still receives a fluctuating signal at one of its nodes. For example, in a circuit including several buffers having their outputs connected to form a single output node (wherein only one of the buffer circuits is enabled at any given time), the output transistors in all but one of the buffer stages would be disabled, while these output transistors still would be influenced by the output signal of the selected stage. In such circuits, the potential for emitter-base breakdown (or $\beta$ degradation) of the output transistors in the unselected stages is a cause for concern.

U.S. Pat. No. 5,179,293 (hereinafter "the Hilton patent") owned by Analog Devices, Inc., discloses one circuit for limiting the reverse-biasing of the base-emitter junctions of transistors in an output stage when the output stage is disabled (but still is influenced by a signal at the output node of the output stage). The circuit disclosed in the Hilton Patent includes a unity-gain complementary emitter-follower (with a characteristically high input impedance) coupled to the output node of the circuit to receive whatever signal is present at the output node. When the output stage is enabled, this output node is driven from the emitters of pair of (large) complementary output-driver transistors. The output of the complementary emitter-follower is switchably connected (via a pair of switching-transistors) to the bases of the pair of output-driver transistors. The pair of switching-transistors is controlled so as to provide the output of the emitter-follower (in addition to a base-emitter voltage drop across each of the pair of switching-transistors) to the bases of the pair of output-driver transistors only when the output stage is disabled. In this manner, when the output stage is disabled, the emitter-base junction of each of the output-driver transistors has a reverse-bias voltage equal to one base-to-emitter voltage drop (Vbe) maintained thereacross.

The circuit in the Hilton patent also includes complex circuitry to minimize the output leakage current that emanates from the complementary emitter-follower when the output stage is disabled. This additional leakage compensation circuitry, as well as the biasing circuitry of the complementary emitter-follower, consume power even when the output stage is enabled and driving a load. Thus, while it is able to switch between enable and disable modes relatively quickly, the Hilton circuit is not extremely power efficient.

Further, because the output-driver transistors in the Hilton circuit are relatively large, the are plagued with substantial base-to-collector and base-to-emitter parasitic capacitances. To attain and maintain the desired reverse-bias voltages across the base-emitter junctions of these (large) drivers, then, a substantial transient charge is required to overcome this parasitic capacitive loading. Additionally, since in disable mode the (large) output devices in the Hilton circuit are not merely disabled, but rather, are reverse-biased by a voltage of one Vbe (i.e., approximately 0.7 volts), a transient charge large enough to cause this (larger than necessary) voltage change across the parasitic base-to-emitter capacitance is required. The Hilton circuit supplies the transient charge (required to charge the parasitic capacitances of its output devices) via its emitter-follower circuit (driven by the output). This transient charge supplying scheme requires active devices, which may consume a significant amount of power, to charge the (large) output devices. Also, an increase in the switching speed of the Hilton circuit necessarily would require an increase in the amount of power consumed by its active transient charge supplying devices.

It therefore is a general aim of the present invention to provide an output stage that protects its output devices (when disabled) from excessive reverse-biased voltages, but that is simpler than prior art circuits and does not consume a significant amount of power in its disabled state. It is an additional aim of the invention to provide an output stage that protects its output devices (when disabled) and is capable of switching at higher speeds (while consuming less power) than prior art circuits.

SUMMARY OF THE INVENTION

According to one aspect of the present invention, a buffer circuit includes a forward buffer and a backward buffer. The forward buffer has an input node to receive a forward input voltage, an output node to provide a forward output voltage that is proportional to the forward input voltage, and a transistor coupled between the input node and the output node to process either the forward input voltage or a feedforward signal generated in response to the forward input voltage. The output and input nodes of the forward buffer also serve, respectively, as the input and output nodes of the backward buffer, to receive a backward input voltage and to provide a backward output voltage that is proportional to the backward input voltage when the forward buffer is disabled. The backward buffer also includes a backward buffer transistor coupled between the input and output nodes of the backward buffer to process either the backward input voltage or a backward signal generated in response to the backward input voltage. According to this aspect, the forward buffer, when enabled, provides a biasing signal that causes the transistor in the backward buffer to be turned off by a voltage that is maintained relative to the forward input voltage, and the backward buffer, when enabled, provides a biasing signal that causes the transistor in the forward buffer to be turned off by a voltage that is maintained relative to the backward input voltage.

According to another aspect of the invention, a buffer includes a transistor coupled between its input node and its output node. The buffer is arranged such that, when the buffer is disabled, a biasing voltage at a first node of the transistor is maintained relative to a biasing voltage at a second node of the transistor through only one or more passive circuit elements. According to another aspect, the biasing voltage at the first and second nodes of the transistor are maintained relative to the output voltage of the circuit.

According to yet another aspect, a buffer circuit includes a forward buffer and a backward buffer. The forward buffer includes a transistor to process either the input voltage to the forward buffer or a feedforward signal generated in response to the input voltage. The backward buffer includes a transistor coupled between an input node to the backward buffer, i.e., the output node to the forward buffer, and the transistor included in the forward buffer to provide a biasing signal that causes the transistor in the forward buffer to be turned off by a voltage that is maintained relative to the input voltage of the backward buffer. The backward buffer according to this aspect consumes a significant amount of power only when the forward buffer is disabled.

According to another aspect of the invention, a method for limiting the reverse-biasing of a transistor in a buffer circuit is disclosed. A buffer circuit is provided which includes a transistor coupled between its input and output to process either the input voltage or a signal generated in response to the input voltage. The buffer circuit is controlled such that a reverse-biased junction of the transistor is shunted with a passive circuit element when the buffer is disabled. According to another aspect, the reverse-biased junction of the transistor is bootstrapped to the output voltage of the buffer when the buffer is disabled.

According to yet another aspect, a method for protecting transistors in a buffer circuit includes providing a forward buffer and a backward buffer. When the forward buffer is enabled the input and output nodes of the backward buffer serve as, respectively, the output and input nodes of the forward buffer. A signal from the forward buffer is used to limit the reverse-biasing of a transistor in the backward buffer when the backward buffer is disabled, and a signal from the backward buffer is used to limit the reverse-biasing of a transistor in the forward buffer when the forward buffer is disabled.

DETAILED DESCRIPTION OF THE INVENTION

Figure 1:
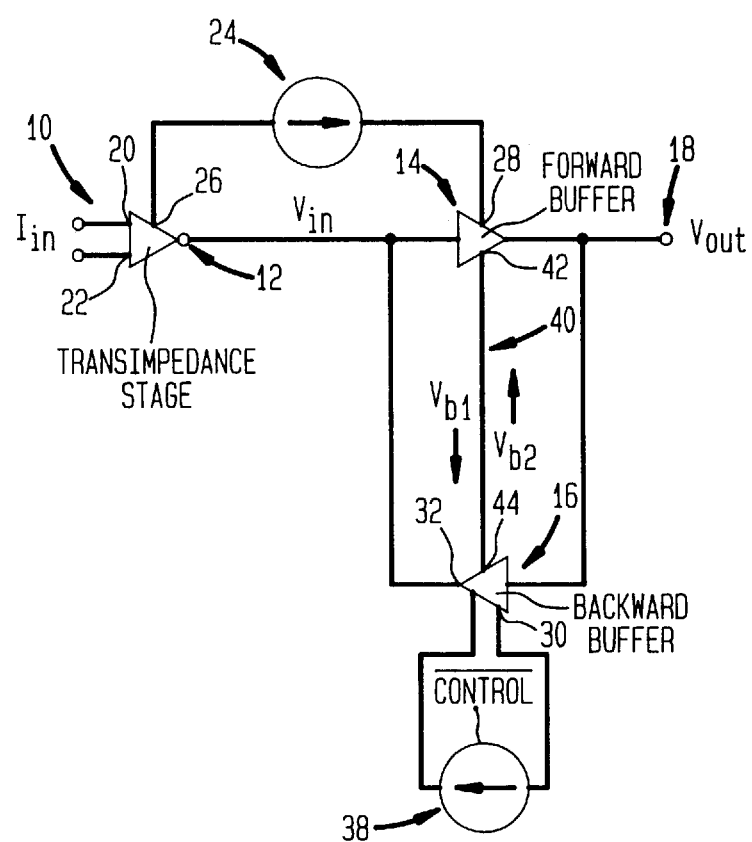
FIG. 1 is a block diagram of a buffer circuit according to the invention.

FIG. 1 is a block diagram of the invention. As shown, a transimpedance stage 10 receives a differential input current $I_{IN}$ between input nodes 20 and 22. A single ended output voltage is provided at the output of transimpedance stage 10, i.e., at high impedance node 12. The voltage produced at high impedance node 12 is provided to the input of forward buffer 14. The input voltage $V_{IN}$ to the forward buffer (or a signal generated in response to the input voltage) is processed by at least one transistor included in forward buffer 14, and an output voltage $V_{OUT}$ (which is proportional to the input voltage $V_{IN}$) is provided at the output of forward buffer 14 to output node 18.

Transimpedance stage 10 and forward buffer 14 include control inputs 26 and 28, respectively. Transimpedance stage 10 is enabled by providing a negative current at control input 26, while forward buffer 14 is enabled by providing a positive current at control input 28. Therefore, current source 24, for example, connected between control inputs 24 and 26 could receive an enabling control signal CONTROL, as shown, to simultaneously enable both transimpedance stage 10 and forward buffer 14.

The voltage at output node 18 also is provided to the input of backward buffer 16. Thus, output node 18 serves both as the output to forward buffer 14 and the input to backward buffer 16. The input voltage to the backward buffer (or a signal generated in response to the input voltage) is processed by at least one transistor included in backward buffer 16, and an output voltage proportional to the input voltage (of the backward buffer) is provided at the output of backward buffer 16 to high impedance node 12. Thus, high impedance node 12 serves as both the input to forward buffer 14 and the output of backward buffer 16.

Backward buffer 16 includes control inputs 30 and 32 and is enabled by providing a negative control current at control input 30 and a positive control current at control input 32. Therefore, current source 38, for example, connected between control inputs 30 and 32, could, as shown, receive an enabling control signal CONTROL to enable backward buffer 16.

Only one of either (1) transimpedance stage 10 and forward buffer 14, or (2) backward buffer 16 will be enabled at any given time, but typically one or the other will be enabled at all times. Thus, in the example shown in FIG. 1, one (and only one) of current sources 24 and 38, or their equivalents, will be enabled at all times during the operation of the circuit. In other words, when transimpedance stage 10 and forward buffer 14 are enabled, backward buffer 16 is disabled, and when backward buffer 16 is enabled, transimpedance stage 10 and forward buffer 14 are disabled.

Referring still to FIG. 1, buffer biasing line 40 is connected between node 42 of forward buffer 14 and node 44 of backward buffer 16. When forward buffer 14 is enabled (and backward buffer 16 is disabled), a biasing voltage (Vb1), which is referenced to the input voltage of the forward buffer (Vin) (e.g., Vb1=Vin+Vx, where Vx is equal to a constant voltage drop, e.g., 0.7 volts) is provided at node 42 of forward buffer 14. The biasing voltage Vb1 thus is provided to node 44 of backward buffer 16, where it is used to maintain a constant (non-destructive) reverse-bias voltage across at least one transistor in backward buffer 16.

Conversely, when backward buffer 16 is enabled (and forward buffer 14 is disabled), a biasing voltage (Vb2), which is referenced to the input voltage of the backward buffer (Vout) (e.g., Vb2=Vout−Vy, where Vy is equal to a constant voltage drop, e.g., 0.7 volts) is provided at node 44 of backward buffer 16. The biasing voltage Vb2 thus is provided to node 42 of forward buffer 14, where it is used to maintain a constant (non-destructive) reverse-bias voltage across at least one transistor in forward buffer 14.

Typically, a circuit such as that shown in FIG. 1 will be included in a larger circuit comprising several circuits identical to that shown in FIG. 1. Also, the output nodes, e.g., output node 18, of each of the several circuits may, for example, be connected together to form a common output node. Such an arrangement could be used, for example, to select one input (from among the inputs of the several circuits) to be provided at the common output node. In such a circuit, then, as explained previously, when a particular (transimpedance stage/forward buffer) combination is selected, the output transistors in the forward buffers of the unselected (transimpedance stage/forward buffer) combinations will remain turned off by a predetermined (non-destructive) voltage, regardless of the voltage present at their outputs, i.e., the output voltage from the selected (transimpedance stage/forward buffer) combination. In addition, the output transistors in the backward buffer associated with the selected (transimpedance stage/forward buffer) combination also will remain reverse-biased by a predetermined (non-destructive) voltage. Thus, the output transistors in all non-enabled forward and backward buffers are protected against breakdown or other destructive phenomena (such as β degradation).

Figure 2:
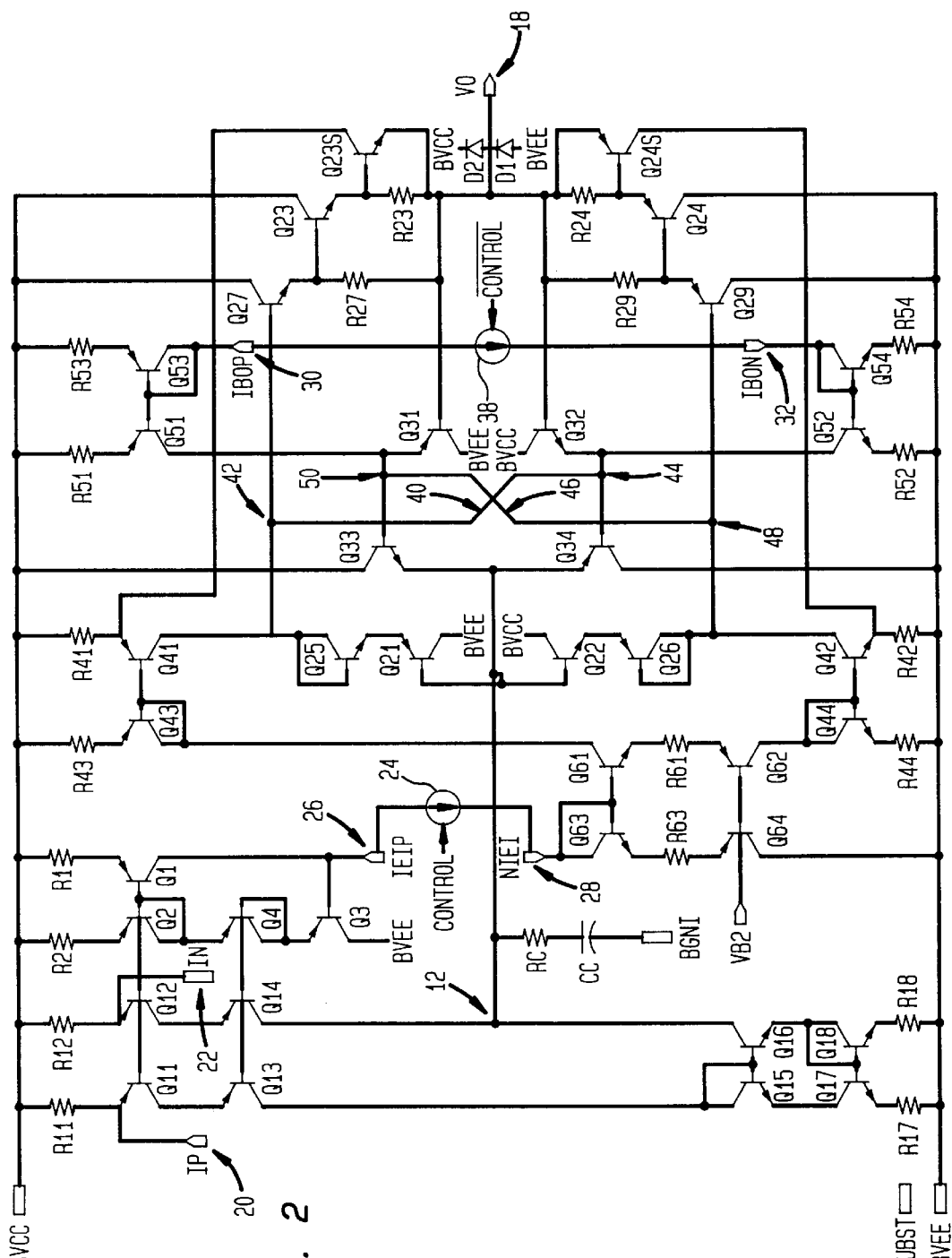
FIG. 2 is a schematic diagram of one implementation of the buffer circuit shown in FIG. 1.

FIG. 2 shows a detailed schematic of one implementation of the circuit shown in FIG. 1. The circuit shown in FIG. 2 is implemented using a high-frequency complementary bipolar (XFCB) process featuring four gigahertz (GHz) corner frequency ($f_T$) NPN and 2.5 GHz $f_T$ PNP transistors. These transistors have high β values, are unencumbered by parasitic transistors and have low parasitic collector-to-substrate capacitance. The base-collector breakdown voltage of these transistors is greater than twelve volts. The emitter-base breakdown voltage (BVebo) of the transistors, however, is approximately seven volts, and the transistors suffer low-current β degradation at emitter-base reverse-bias voltages of less than three volts. Therefore, the circuit shown in FIG. 2 is implemented so as to limit the reverse-bias voltage across all emitter-base junctions in the circuit.

Transimpedance stage 10 (shown in FIG. 1) is implemented in FIG. 2 with transistors Q1–Q4 and Q11–Q18. More particularly, transimpedance stage 10 includes a base-current corrected current mirror (including PNP transistors Q1–Q4), PNP current source transistors Q11 and Q12, PNP cascode transistors Q13 and Q14 and a Wilson current mirror (including NPN transistors Q15–Q18). Transimpedance stage 10 is enabled by steering a current of approximately fifty micro-amps ($\mu$A) out of control node 26. The base-current corrected current mirror (including transistors Q1–Q4) amplifies the control current and "lights up" current sources Q11 and Q12. Differential current input nodes 20 and 22 are connected to the emitters of current sources Q11 and Q12, respectively. These input nodes may be connected, for example, to the differential outputs of a preceding transconductance stage to receive a differential current therefrom.

Cascode transistors Q13 and Q14 have their emitters connected, respectively, to the collectors of current source transistors Q11 and Q12, and their bases are biased by the voltage at the base-collector connection of diode-connected transistor Q4 in the base-current corrected current mirror. The collector of cascode transistor Q13 is fed to the Wilson current mirror. The output of the Wilson current mirror and the output, i.e., the collector, of cascode transistor Q14 are connected together at a high impedance node 12. The cascode transistors and the Wilson current mirror serve to increase the open-loop dc-gain of the transimpedance stage. The output of the transimpedance stage, after being compensated by resistor RC and capacitor CC (to increase the phase margin of the circuit), is fed to a forward buffer.

The circuit shown in FIG. 2 implements forward buffer 14 (shown in FIG. 1) as a unity-gain Darlington complementary emitter-follower comprising transistors Q21–Q28. More particularly, complementary PNP transistors Q21 and Q22 (receiving a voltage input at their bases from high impedance node 12) form a pre-driver-stage, complementary NPN transistors Q27 and Q28 (receiving inputs at their bases from the emitters of transistors Q21 and Q22, respectively, via diode connected transistors Q25 and Q26) form an intermediate driver-stage, and complementary PNP transistors Q23 and Q24 (receiving inputs at their bases from the emitters of transistors Q27 and Q28, respectively) form an output-driver-stage.

Pre-driver transistors Q21 and Q22 are biased by currents from, respectively, a PNP current mirror (including transistors Q41 and Q43) and an NPN current mirror (including transistors Q42 and Q44). These two current mirrors both are driven by a current produced by a floating current mirror (comprising PNP transistors Q62 and Q64 and NPN transistors Q61 and Q63). This floating current mirror is, in turn, driven by a current applied at control input 28, which could be, for example, the same control input 28 that is shown in FIG. 1. Thus, when a positive control current is applied at control input 28, the forward buffer is enabled. The output current of the forward buffer is limited by current sense transistors Q23S and Q24S, which measure the voltage drop across degeneration resistors R23 and R24. Degeneration resistors R23 and R24 are connected, respectively, between the emitters of output-driver transistors Q23 and Q24 and output node 18 forward buffer 14. The collectors of current-sense transistors Q23S and Q24S are connected to the emitters of current mirror transistors Q41 and Q42, respectively, to prevent the collector-base junctions of the current-sense transistor from reverse-biasing when the forward buffer is disabled.

Rather than being biased by current sources, intermediate-driver transistors Q27 and Q28 are biased by resistors R27 and R28, respectively, with resistor R27 being connected between the emitter of transistor Q27 and output node 18, and resistor R28 being connected between the emitter of transistor Q28 and the output node. The benefits provided by this particular biasing, arrangement are explained in detail below in connection with a description of the circuitry that maintains the reverse-biasing of the forward buffer transistors, i.e., transistors Q21–Q28, at particular (non-destructive) voltages when forward buffer 14 is disabled.

Backward buffer 16 (shown in FIG. 1) is implemented in the circuit shown in FIG. 2 by PNP transistors Q31 and Q32 (receiving an input voltage, i.e., a backward input voltage, at their bases from output node 18, which, in this case, is serving as the input node to the backward buffer) and NPN transistors Q33 and Q34 (receiving signals from the emitters of transistors Q31 and Q32, respectively). The emitters of transistors Q33 and Q34 both are connected to high-impedance node 12. Thus, the signals from the emitters of transistors Q33 and Q34 together establish an output signal of backward buffer 16, i.e., the backward output voltage, and high-impedance node 12, in this case, serves as a backward buffer output node.

Transistors Q31 and Q32 are biased by currents from, respectively, a PNP current mirror (including transistors Q51 and Q53) and a NPN current mirror (including transistors Q52 and Q54). These current mirrors are driven, in turn, by currents at control nodes 30 and 32. Thus, by providing a negative current at control node 30 and a positive current at control node 32, the backward buffer is enabled. Conversely, by not providing currents at control nodes 30 and 32, the backward buffer is disabled.

Interconnect lines 40 and 46 supply biasing voltages between the forward and backward buffers when one or the other of the buffers is disabled. Particularly, interconnect line 40 connects node 42, i.e., the base of transistor Q27 and the collector-base junction of diode-connected transistor Q25, to node 44, i.e., the emitter of transistor Q32 and the base of transistor Q34. Nodes 42 and 44 (as well as interconnect line 46) could correspond, for example, to identically referenced elements in the circuit shown in FIG. 1. Similarly, interconnect line 46 connects node 48, i.e., the base of transistor Q28 and the collector-base junction of diode-connected transistor Q26, to node 50, i.e., the emitter of transistor Q31 and the base of transistor Q33. It should be understood that interconnect lines 40 and 46, as well as nodes 42, 44, 48 and 50 have been labeled as distinct entities for convenience of description only, and that node 42, node 44 and interconnect line 40 actually form a single circuit node, as do node 46, node 50 and interconnect line 46.

Referring now to FIGS. 1 and 2, when transimpedance stage 10 and forward buffer 14 are enabled, i.e., a positive current is provided at control node 26 and a negative current is provided at control node 28, backward buffer 16 should be disabled, i.e., no currents should be provided at control nodes 30 and 32. In this case, the voltage at high impedance node 12, which is serving as the voltage input node to forward buffer 14, i.e., the forward input node, is processed by the Darlington complementary emitter-follower (including transistors Q21–Q28), and the output of the Darlington complementary emitter-follower provides an output voltage at output node 18, which, in this case, is serving as the voltage output node of forward buffer 14, i.e., the forward output node.

Because forward-biased transistor Q21 and forward-biased diode-connected transistor Q25 each provide a voltage drop of one Vbe across their emitter-base junctions, the voltage at node 42, in this case, should be (approximately) +2Vbe volts above the voltage at high impedance node 12. Similarly, since forward-biased transistor Q22 and forward-biased diode-connected transistor Q26 each provide voltage drop of one Vbe across their emitter-base junctions, the voltage at node 48 should be (approximately) 2Vbe volts below the voltage at node 12.

Also, since forward-biased transistors Q27, Q28, Q23 and Q24 each provide a voltage drop of one Vbe across their emitter-base junctions, the voltage at output node 18 should be (approximately) equal to the voltage at high-impedance node 12. Therefore, the voltage at node 44 (which is connected to node 42 by interconnect line 40) and the voltage at node 50 (which is connected to node 48 by interconnect line 46) are offset from the both the forward input voltage and the forward output voltage by (approximately) 2Vbe volts. Thus, interconnect lines 40 and 46 provide biasing voltages to transistors Q31–Q34 that, in conjunction with the voltages at forward input and output nodes 12 and 18, respectively, cause the emitter-base junctions of each of transistors Q31–Q34 to be reverse-biased by (approximately) 2Vbe volts. In this state, then, regardless of the value of the forward input voltage, the emitter-base junction of each of the transistors in the (disabled) back buffer 16 remains reverse-biased by (approximately) 2Vbe volts.

On the other hand, when transimpedance stage 10 and forward buffer 14 are disabled, i.e., no currents are provided at control nodes 26 and 28, backward buffer 16 should be enabled, i.e., a negative current should be provided at control node 30 and a positive current should be provided at control node 32. In this state, output node 18 serves as the input node to backward buffer 16 (including transistors Q31–Q34), i.e., the backward input node, and high impedance node 12 serves as the output node to backward buffer 16, i.e., the backward output node. Because of the voltage drops across the emitter-base junctions of forward-biased transistors Q31 and Q32, the voltages at nodes 50 and 44 are, respectively, (approximately) one Vbe above and one Vbe below the backward input voltage, i.e., the voltage received at output node 18 when the backward buffer is enabled.

Also, because of the emitter-base voltage drops across forward-biased transistors Q33 and Q34, the backward output voltage, i.e., the voltage provided at high-impedance node 12 when backward buffer 14 is enabled, should be (substantially) equal to the backward input voltage. Thus, diode-connected transistor Q25 and the emitter-base junction of transistor Q21, in series, will be kept reverse-biased by (approximately) Vbe volts (created by to the voltage drop across the emitter-base junction of forward-biased transistor Q34). Similarly, diode-connected transistor Q26 and the emitter-base junction of transistor Q22, in series, also will be kept reverse-biased by (approximately) Vbe volts (created by the voltage drop across the emitter-base junction of forward-biased transistor Q33).

Additionally, since the voltage at node 42 is (approximately) one Vbe below the backward input voltage, i.e., the voltage drop across the emitter-base junction of forward-biased transistor Q32, the emitter-base junction of intermediate-driver transistor Q27 will remain reverse-biased by approximately one Vbe, regardless of the voltage at backward input node 18. Similarly, since the voltage at node 48 is (approximately) one Vbe below the backward input voltage, i.e., the voltage drop across the emitter-base junction of forward-biased transistor Q31, the emitter-base junction of intermediate-driver transistor Q28 also will remain reverse-biased by approximately one Vbe, regardless of the voltage at backward input node 18.

Because the emitter-base junctions of pre-driver transistors Q23 and Q24 remain reverse-biased (i.e., turned off) by one Vbe (regardless of the backward input voltage), biasing currents no longer will flow through resistors R27 and R28. The lack of currents through these resistors, in turn, will cause the emitter-base junctions of output-driver transistors Q23 and Q24 to collapse to zero. Thus, with pre-driver transistors Q27 and Q28 turned off, resistors R27 and R28 act as shunt resistors that serve to bootstrap the bases of output-driver transistors Q23 and Q24 to the output voltage. Hence, regardless of the value of the backward input voltage at backward input node 18, the base-emitter junctions of output-driver transistors Q23 and Q24 are kept zero-biased.

Bootstrapping the bases of the (large) output-driver transistors in this manner has at least two distinct advantages. First, a substantial transient charge is required to charge the (relatively large) base-to-collector parasitic capacitances of the large output-driver transistors. If this transient charge were provided by an active circuit component, a significant amount of power would have to be consumed to bias and/or drive the component to provide such charge. In the buffer circuit according to the invention, however, the transient charge required to charge these parasitic capacitances is supplied by an external device, e.g., another identical buffer circuit having an output connected to output node 18. That is, the transient charge required to charge the parasitic capacitances of output-driver transistors Q23 and Q24 is supplied by the output node and is provided to the bases of driving transistors Q23 and Q24 via, respectively, shunting transistors R27 and R28.

Second, the buffer circuit according to the invention zero-biases the emitter-base junctions of its output-driver transistors rather than reverse-biasing them by one Vbe. According to this biasing scheme, the output-driver transistors are capable of switching between their enabled and disabled modes (which entails the charging and discharging of their parasitic capacitances) at a faster rate.

It should be understood that while the buffer circuit described herein employs bipolar junction transistors (BJTs), the circuit could equivalently be implemented using metal oxide semiconductor (MOS) or any other transistor type without departing from the intended scope of the invention. Also, other implementations of the various circuit units, i.e., the transimpedance stage, the forward buffer and the backward buffer, could be employed without departing from the scope of the invention. In addition, while the control signals that enable the transimpedance stage, forward buffer and backward buffer have been described as currents that drive biasing devices, e.g., current mirrors, the control signals likewise could be voltages and the transistors in the different stages equivalently could be biased using voltages.

Having thus described at least one illustrative embodiment of the invention, various alterations, modifications and improvements will readily occur to those skilled in the art. Such alterations, modifications and improvements arc intended to be within the spirit and scope of the invention. Accordingly, the foregoing description is by way of example only and is not intended as limiting. The invention is limited only as defined in the following claims and the equivalents thereto.

What is claimed is:

1. A buffer circuit, comprising: a forward buffer, the forward buffer receiving a first control signal to enable the forward buffer and a forward input signal from a first node, and, when the forward buffer is enabled, the forward buffer providing a forward output signal having an amplitude that is proportional to an amplitude of the forward input signal to a second node, the forward buffer including at least one forward buffer transistor coupled between the first and second nodes, the at least one forward buffer transistor being biased such that, when the forward buffer is enabled, the at least one forward buffer transistor varies the amplitude of the forward output signal in response to changes in the amplitude of the forward input signal, the at least one forward buffer transistor including a control terminal and a current terminal; and a backward buffer, the backward buffer receiving a second control signal to enable the backward buffer and a backward input signal from the second node, and, when the backward buffer is enabled, the backward buffer providing a backward output signal having an amplitude that is proportional to an amplitude of the backward input signal to the first node, the backward buffer including at least one backward buffer transistor coupled between the first and second nodes, the at least one backward buffer transistor being biased such that, when the backward buffer is enabled, the at least one backward buffer transistor varies the amplitude of the backward output signal in response to changes in the amplitude of the backward input signal, the at least one backward buffer transistor including a control terminal and a current terminal;

wherein the forward buffer is coupled to the backward buffer such that, when the backward buffer is disabled and the forward buffer is enabled, the forward buffer provides a first biasing signal to the backward buffer that prevents a first voltage presented between the control terminal and the current terminal of the at least one backward buffer transistor from exceeding a first voltage limit to prevent the at least one backward buffer transistor from being damaged; and wherein the backward buffer is coupled to the forward buffer such that, when the forward buffer is disabled and the backward buffer is enabled, the backward buffer provides a second biasing signal to the forward buffer that prevents a second voltage presented between the control terminal and the current terminal of the at least one forward buffer transistor from exceeding a second voltage limit to prevent the at least one forward buffer transistor from being damaged.

2. The buffer circuit as claimed in claim 1, wherein:
the buffer circuit further comprises a preceding circuit stage that receives a differential input signal and provides a single-ended signal at its output; and
the first node is coupled to the output of the preceding circuit stage.

3. The buffer circuit as claimed in claim 2, wherein the preceding circuit stage includes a transimpedance stage.

4. The buffer circuit as claimed in claim 3, wherein:
the transimpedance stage receives a third control signal to enable the transimpedance stage, and
the transimpedance stage and the forward buffer each consume power only when enabled.

5. The buffer circuit as claimed in claim 1, wherein the at least one forward buffer transistor includes a Darlington complementary emitter-follower circuit.

6. The buffer circuit as claimed in claim 1, wherein the at least one forward buffer transistor is an output-driver transistor of the forward buffer.

7. The buffer circuit as claimed in claim 1, wherein the backward buffer consumes power only when the forward buffer is disabled.

8. A buffer circuit, comprising:
a forward buffer, the forward buffer receiving a first control signal to enable the forward buffer and a forward input signal from a first node, and, when the forward buffer is enabled, the forward buffer providing a forward output signal having an amplitude that is proportional to an amplitude of the forward input signal to a second node, the forward buffer including at least one transistor coupled between the first and second nodes, the at least one transistor being biased such that, when the forward buffer is enabled, the at least one transistor varies the amplitude of the forward output signal in response to chances in the amplitude of the forward input signal, the forward buffer further including an additional transistor and a resistive element, the resistive element being coupled to a current terminal of the additional transistor such that an amount of current that flows through the resistive element is controlled by the additional transistor, the resistive element being coupled between a control terminal and a current terminal of the at least one transistor; and
a backward buffer, the backward buffer receiving a backward input signal from the second node, the backward buffer being coupled to the forward buffer such that, when the forward buffer is disabled and the backward buffer is enabled, the backward buffer provides a biasing signal to the forward buffer that causes the additional transistor to limit the amount of current that flows through the resistive element, thereby limiting a voltage that is presented between the control terminal and the current terminal of at least one transistor to prevent the at least one transistor from being damaged.

9. The buffer circuit as claimed in claim 8, wherein the at least one transistor includes at least one output-driver transistor.

10. The buffer circuit as claimed in claim 9, wherein the at least one transistor is a bipolar transistor and the current terminal of the at least one transistor is the emitter of the bipolar transistor.

11. The buffer circuit as claimed in claim 9, wherein the additional transistor serves as an intermediate-driver transistor of the forward buffer when the forward buffer is enabled.

12. The buffer circuit as claimed in claim 8, wherein:

the buffer circuit further comprises a preceding circuit stage that receives a differential input signal and provides a single-ended signal at its output; and the first node is coupled to the output of the preceding circuit stage.

13. The buffer circuit as claimed in claim 8, wherein the resistive element includes a resistor.

14. A buffer circuit, comprising:

a forward buffer, the forward buffer receiving a first control signal to enable the forward buffer and a forward input signal at a forward buffer input node, and, when the forward buffer is enabled, the forward buffer providing a forward output signal having an amplitude that is proportional to an amplitude of the forward input signal to a circuit node, the forward buffer including at least one transistor coupled between the forward buffer input node and the circuit node, the at least one transistor being biased such that, when the forward buffer is enabled, the at least one transistor varies the amplitude of the forward output signal in response to changes in the amplitude of the forward input signal, the at least one transistor including a control terminal and a current terminal; and a backward buffer, the backward buffer receiving a backward input signal on the circuit node, the backward buffer being coupled to the forward buffer such that, when the forward buffer is disabled and the backward buffer is enabled, the backward buffer provides a biasing signal to the forward buffer that prevents a voltage presented between the control terminal and the current terminal of the at least one transistor from exceeding a voltage limit to prevent the at least one transistor from being damaged;

wherein the backward buffer consumes power only when the forward buffer is disabled.

15. A method for limiting a reverse-biasing of at least one transistor in a buffer circuit, comprising the steps of:

providing a forward buffer circuit which receives a control signal to enable the forward buffer circuit and a forward input signal from a first node and, when the forward buffer circuit is enabled, the forward buffer circuit provides a forward output signal having an amplitude that is proportional to an amplitude of the forward input signal to a second node, the forward buffer circuit including the at least one transistor coupled between the first and second nodes, the at least one transistor being biased such that, when the forward buffer circuit is enabled, the at least one transistor varies the amplitude of the forward output signal in response to changes in the amplitude of the forward input signal, the forward buffer circuit further including an additional transistor and a resistive element, the resistive element being coupled to a current terminal of the additional transistor such that an amount of current that flows through the resistive element is controlled by the additional transistor, the resistive element being coupled between a control terminal and a current terminal of the at least one transistor;

providing a backward buffer circuit which receives a backward input signal from the second node; and in response to the forward buffer circuit being disabled and the backward buffer circuit being enabled, providing a biasing signal to the forward buffer circuit from the backward circuit that causes the additional transistor to limit the amount of current that flows though the resistive element, thereby limiting a voltage that is presented between the control terminal and the current terminal of the at least transistor to prevent the at least one transistor from being damaged.

16. The method according to claim 15, wherein the step of providing the biasing signal to the forward buffer circuit from the backward buffer circuit includes the step of providing the biasing signal to the forward buffer circuit from to backward buffer circuit such that the additional transistor prevents current from flowing through the resistive element, thereby maintaining the voltage between the control terminal and the current terminal of the at least one transistor at approximately zero volts.

17. A method for protecting transistors in a buffer circuit, including the steps of:

providing a forward buffer which receives a first control signal to enable the forward buffer and a forward input signal from a first node and, when the forward buffer is enabled, the forward buffer provides a forward output signal to a second node, providing a backward buffer which receives a second control signal to enable the backward buffer and a backward input signal from the second node and, when the backward buffer is enabled, the backward buffer provides a backward output signal to the first node, when the backward buffer is disabled and the forward buffer is enabled, providing at least one first biasing signal to the backward buffer from the forward buffer to limit a reverse-biasing of at least one first transistor included in the backward buffer, the at least one first transistor being coupled between the first and second nodes and biased such that, when the backward buffer is enabled, the at least one first transistor varies an amplitude of the backward output signal in response to changes in an amplitude of the backward input signal, and when the forward buffer is disabled and the backward buffer is enabled, providing at least one second biasing signal to the forward buffer from the backward buffer to limit a reverse-biasing of at least one second transistor included in the forward buffer, the at least one second transistor being coupled between the first and second nodes and biased such that, when the forward buffer is enabled, the at least one second transistor varies an amplitude of the forward output signal in response to changes in an amplitude of the forward input signal.

* * * * *

UNITED STATES PATENT AND TRADEMARK OFFICE
CERTIFICATE OF CORRECTION

PATENT NO. : 5,869,995
DATED : February 9, 1999
INVENTOR(S) : Kimo Y. F. Tam

It is certified that error appears in the above-identified patent and that said Letters Patent is hereby corrected as shown below:

IN THE CLAIMS

Column 12, line 12, after "backward", please add --buffer--.

Column 12, line 16, after the first "at least", please add --one--.

Column 12, line 22, please replace "to" with --the--.

Signed and Sealed this

Seventh Day of December, 1999

Attest:

Q. TODD DICKINSON

Attesting Officer

Acting Commissioner of Patents and Trademarks